US012729438B2

(12) United States Patent
Nakagawa et al.

(10) Patent No.: US 12,729,438 B2
(45) Date of Patent: Sep. 8, 2026

(54) PROCESS CHAMBER GAS SUPPLY IMPROVEMENT

(71) Applicant: Applied Materials, Inc., Santa Clara, CA (US)

(72) Inventors: Toshiyuki Nakagawa, Narita (JP); Shu-Kwan Lau, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 420 days.

(21) Appl. No.: 18/397,468

(22) Filed: Dec. 27, 2023

(65) Prior Publication Data

US 2025/0215566 A1 Jul. 3, 2025

(51) Int. Cl.
*C23C 16/455* (2006.01)

(52) U.S. Cl.
CPC .............................. *C23C 16/45561* (2013.01)

(58) Field of Classification Search
CPC ................................................ C23C 16/45561
See application file for complete search history.

(56) References Cited

U.S. PATENT DOCUMENTS 10,119,192 B2 11/2018 Aboagye et al.
2002/0025657 A1* 2/2002 Anderson ......... C23C 16/45574 438/478
2014/0261185 A1* 9/2014 Aboagye ........... C23C 16/45502 118/728
2014/0273410 A1 9/2014 Abedijaberi et al.
2014/0322897 A1* 10/2014 Samir ................. H10P 72/0402 118/733
2022/0349056 A1 11/2022 Lin
2025/0215566 A1* 7/2025 Nakagawa ........ C23C 16/45561

FOREIGN PATENT DOCUMENTS

JP 08239775 9/1996
KR 2017-0084372 A 7/2017

OTHER PUBLICATIONS

International Search Report dated Mar. 11, 2025 for Application No. PCT/US2024/058708.

* cited by examiner

*Primary Examiner* — Jeffrie R Lund
(74) *Attorney, Agent, or Firm* — Patterson + Sheridan, LLP

(57) ABSTRACT

A process chamber is provided including: a chamber body and one or more liners disposed around an interior volume; a gas manifold including a plurality of inlet portions and a plurality of outlet portions, each inlet portion fluidly coupled to one of the outlet portions; a plurality of gas inlet channels, each gas inlet channel formed by one or surfaces of the one or more liners and each gas inlet channel fluidly coupled to the interior volume; a plurality of connectors, each connector extending from one of the gas inlet channels into one of the outlet portions of the gas manifold; and a seal positioned around each connector at a location inside one of the outlet portions of the gas manifold.

20 Claims, 6 Drawing Sheets

100
101
140
110
115
134
Gas Source
CV1
CV2
CV3
CV4
CV5
S1
S2
S3
S4
S5
$150_1$
$150_2$
$150_3$
$150_4$
$150_5$
$150_6$
$150_7$
$150_8$
$150_9$
$150_{10}$
50
C
155
Y
Z
X
185
CONTROLLER
186
187
188

PROCESS CHAMBER GAS SUPPLY IMPROVEMENT

BACKGROUND

Field

Embodiments of the present disclosure generally relate to improvements in the gas supply equipment of process chambers for the processing of substrates, such as semiconductor substrates.

Description of the Related Art

Gases are provided to the interior of process chambers to perform processes (e.g., depositions or etching processes) on substrates, such as semiconductor substrates. The substrate is positioned on a substrate support in the interior of the process chamber. Gases are typically provided either (1) from above the substrate support, for example using a showerhead, or (2) from the side, for example through a sidewall of the process chamber. When gas is provided from the side, the gas is directed from a gas injector assembly along a generally horizontal path over the substrate support and towards an exhaust on the opposing side of the process chamber. Although these gas injector assemblies can often be used to achieve the intended process results (e.g., high levels of deposition uniformity across a substrate), there are also instances when intended process results are difficult to achieve or difficult to maintain over time. These difficulties are exacerbated by the ever-shrinking size of components formed in semiconductor devices.

Thus, there is a continuing need to improve components, such as the gas supply equipment to process chambers, to ensure process goals, such as deposition thickness uniformity, continue to be achieved and maintained over time, such as over the useful life of a process chamber.

SUMMARY

Embodiments of the present disclosure generally relate to improvements in the gas supply equipment of process chambers for the processing of substrates, such as semiconductor substrates.

In one embodiment, a process chamber is provided including: a chamber body and one or more liners disposed around an interior volume; a gas manifold including a plurality of inlet portions and a plurality of outlet portions, each inlet portion fluidly coupled to one of the outlet portions; a plurality of gas inlet channels, each gas inlet channel formed by one or surfaces of the one or more liners and each gas inlet channel fluidly coupled to the interior volume; a plurality of connectors, each connector extending from one of the gas inlet channels into one of the outlet portions of the gas manifold; and a seal positioned around each connector at a location inside one of the outlet portions of the gas manifold.

In another embodiment, a process chamber is provided comprising: a chamber body and one or more liners disposed around an interior volume; a substrate support disposed in the interior volume; a gas manifold including a plurality of inlet portions and a plurality of outlet portions, each inlet portion fluidly coupled to one of the outlet portions; a plurality of gas inlet channels, each gas inlet channel formed by one or surfaces of the one or more liners and each gas inlet channel fluidly coupled to the interior volume; and a plurality of connectors, each connector fluidly coupling one of the outlet portions of the gas manifold to one of the gas inlet channels, wherein each connector forms a sealed connection with a corresponding outlet portion of the gas manifold.

In another embodiment, a processing system is provided comprising: a process chamber comprising: a chamber body and one or more liners disposed around an interior volume; a substrate support disposed in the interior volume; a gas manifold including a plurality of inlet portions and a plurality of outlet portions, each inlet portion fluidly coupled to one of the outlet portions; a plurality of gas inlet channels, each gas inlet channel formed by one or surfaces of the one or more liners and each gas inlet channel fluidly coupled to the interior volume; a plurality of connectors, each connector extending from one of the gas inlet channels into one of the outlet portions of the gas manifold; and a seal positioned around each connector at a location inside one of the outlet portions of the gas manifold; and a plurality of valves, each valve fluidly coupled to a different inlet portion of the gas manifold.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to improvements in the gas supply equipment of process chambers for the processing of substrates, such as semiconductor substrates. The improved gas supply equipment is configured to direct the gas in a generally horizontal path over the substrate support during processing. The improved gas equipment includes gas delivery assemblies that include improvements to prevent unintended diffusion of gas to unintended locations within gas delivery assemblies. The improvements include using a sealed connection to direct the gas into the gas delivery channels formed by liners within the process chamber. These sealed connections prevent diffusion of gas within the gas delivery assemblies, particularly in the angular direction. When process gases are able to diffuse in the angular direction within a gas delivery assembly configured to direct gas horizontally over a substrate, the precise control of the different concentrations of gas over different portions of the substrate that are used to achieve high levels of process uniformity is lost. Furthermore, diffusion of gas in the angular direction can cause unintended deposits and corrosion within the gas delivery assembly over time, which can eventually prevent the intended levels of process uniformity from being achieved.

Although the following disclosure mainly describes improvements in equipment and methods for achieving higher levels of process uniformity for depositions performed on substrates in an epitaxial deposition chamber, the benefits of this disclosure can also be applied to other deposition chambers (e.g., chemical vapor deposition (CVD) chambers or plasma enhanced CVD chambers) as well as to process chambers configured to perform different processes, such as etching. More generally, the benefits of this disclosure can apply to any process chamber that directs in a generally horizontal path over a substrate.

Figure 1A:
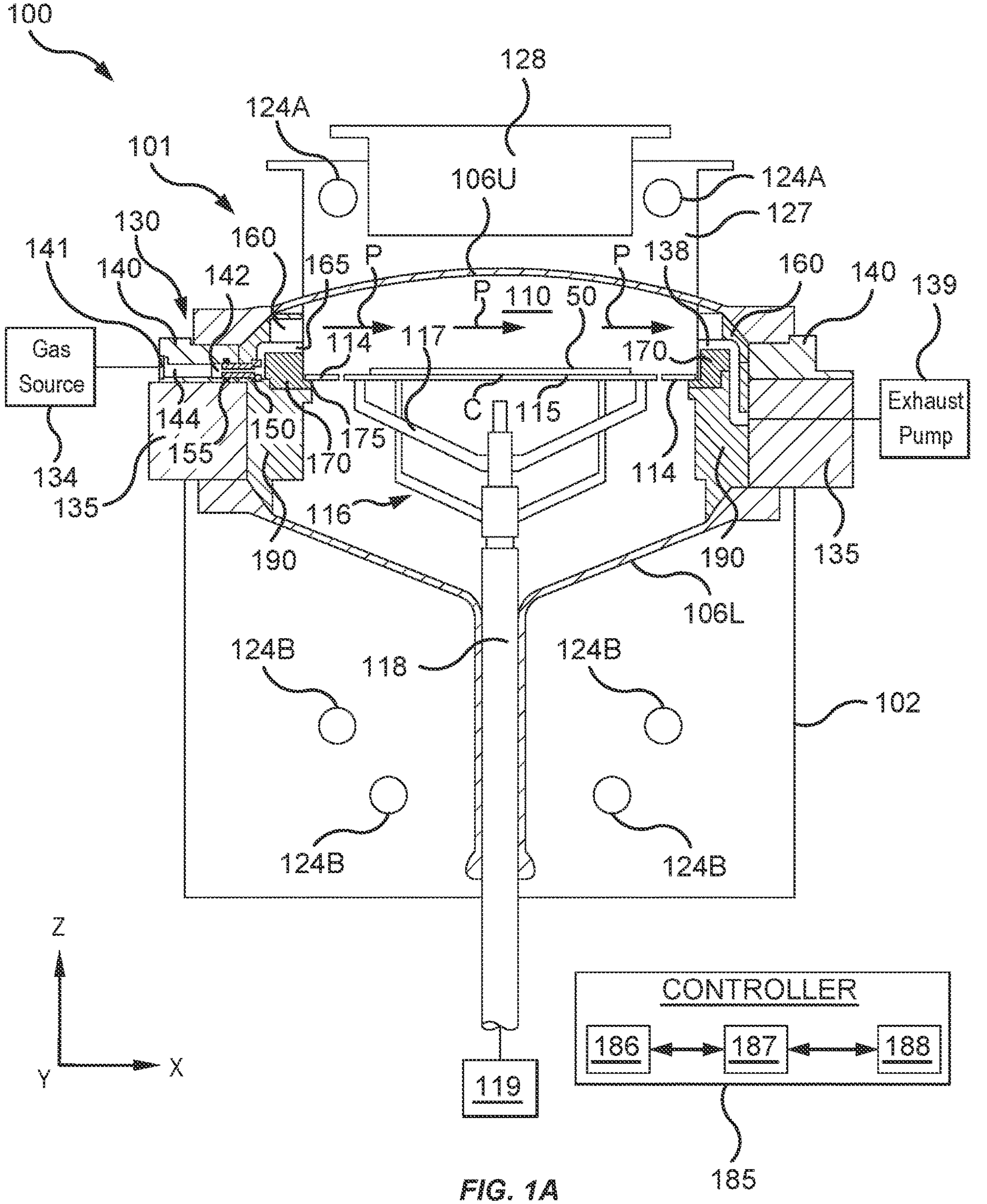
FIG. 1A is a cross-sectional view of a processing system, according to one embodiment.

FIG. 1A is a cross-sectional view of a processing system 100, according to one embodiment. The processing system 100 includes a process chamber 101, a gas source 134, an exhaust pump 139, and a controller 185. The processing system 100 can be configured to perform epitaxial deposition processes in the process chamber 101 as well as other processes, such as cleaning processes. The processing system 100 further includes a plurality of valves, sensors, and piping that is described below in reference to FIG. 1C.

The process chamber 101 includes a chamber body 102. In some embodiments, the chamber body 102 can be made of a process resistant material, such as aluminum or stainless steel, for example 316L stainless steel. The chamber body 102 is disposed around structural components of the process chamber 101, such as a lower window 106L. Other components of the process chamber 101 can be mounted to or supported by the chamber body 102.

The process chamber 101 includes the lower window 106L and an upper window 106U. In one embodiment, the windows 106U, 106L can each be formed of quartz. The process chamber 101 can further include an upper liner 160, a middle liner 170, and a lower liner 190. The upper liner 160 is positioned over the middle liner 170 and the lower liner 190. The middle liner 170 is disposed at a vertical location between the lower liner 190 and the upper liner 160. The liners 160, 170, 190 can each be formed of a ceramic material, such as quartz.

The liners 160, 170, 190 can be positioned between the windows 106U, 106L and the chamber body 102 and other components (e.g., gas manifold 140 and base plate 135 as described below) to insulate the windows 106U, 106L from the chamber body 102 and these other components. The windows 106U, 106L and the liners 160, 170, 190 enclose an interior volume 110 (also referred to as process volume) of the process chamber 101.

The process chamber 101 further includes a substrate support assembly 116 in the interior volume 110. The substrate support assembly 116 can include supports 117 and a shaft 118. A susceptor 115 (also referred to as substrate support) can be positioned on the supports 117. The substrate support assembly 116 can further include an actuator 119 to rotate the shaft 118 and the susceptor 115. A substrate 50 can be positioned on the susceptor 115 during processing, such as during an epitaxial deposition. The process chamber 101 can further include a preheat ring 114 that can be positioned on a ledge 175 of the middle liner 170. The preheat ring 114 extends around the susceptor 115.

The process chamber 101 can further include upper lamp modules 124A and lower lamp modules 124B for heating of the substrate 50 and/or the interior volume 110. In one embodiment, the upper lamp modules 124A and the lower lamp modules 124B are infrared (IR) lamps.

The process chamber 101 further includes an outer reflector 127 and an inner reflector 128 positioned over the upper window 106U. The outer reflector 127 can be positioned around the inner reflector 128. In some embodiments one or more upper lamp modules 124A can be positioned inside the outer reflector 127.

The process chamber 101 further includes a gas delivery assembly 130. The gas delivery assembly 130 includes the components of the process chamber 101 that are configured to deliver gas to the interior volume 110. These components of the gas delivery assembly 130 include a gas manifold 140, a plurality of connectors 150, a seal 155 around each connector 150, and the liners 160, 170, 190.

The process chamber 101 can further include a gas inlet channel 165 extending through the liners 160, 170, 190 to provide a gas flow path into the interior volume 110 from the gas delivery assembly 130. In some embodiments, the gas inlet channel 165 is formed by surfaces of the liners 160, 170, 190 in which each liner 160, 170, 190 forms at least one of the surfaces of the inlet channel 165. Some embodiments can include a single gas inlet channel 165 that is fluidly coupled with each of the connectors 150. Other embodiments can include a plurality of gas inlet channels 165, such as a separate gas delivery channel for each connector 150.

The process chamber 101 further includes a base plate 135 mounted to the chamber body 102. The base plate 135 can be disposed around the lower liner 190. In some embodiments, the base plate 135 has a ring shape.

The gas delivery assembly further includes the gas manifold 140 positioned over the base plate 135. The gas manifold 140 can be formed of a metallic material, such as stainless steel. In some embodiments, the gas manifold can have a ring shape and can be referred to an inject ring. The gas manifold 140 can include a plurality of inlet portions 141 (also referred to as inlets) and a plurality of outlet portions 142 (also referred to as outlets). Each inlet portion 141 is fluidly coupled to one of the outlet portions 142 by a corresponding internal channel 144 of the gas manifold 140. Each inlet portion 141 is connected to the gas source 134. The flowrate of gases provided to each inlet portion 141 can be individually adjusted to control the flowrate of the gases over different portions of the substrate 50 as described in further detail below. In some embodiments, the plurality of outlet portions 142 can be positioned at a same vertical location in the Z-direction and coupled to different connectors 150 at different angular locations (see FIG. 1C) relative to a center C of the susceptor 115. In some embodiments, each outlet portion 142 is equidistant to the center C of the susceptor 115.

The gas delivery assembly 130 can further include the plurality of connectors 150 with each connector 150 fluidly coupled to one of the outlet portions 142 of the gas manifold 140. The connectors 150 can be formed of a ceramic material, such as quartz. In some embodiments, each connector 150 is positioned partially in one of the outlet portions 142 of the gas manifold 140. Each connector 150 includes an internal channel 154 (see FIG. 1B) extending from a position located inside one of the outlet portions 142 of the gas manifold 140 to a position located the gas inlet channel 165 formed by the surfaces of the liners 160, 170, 190. In some embodiments, each connector 150 can extend past an interior wall of the upper liner 160 and an interior wall of the lower liner 190, which can help prevent any gases from diffusing into regions (e.g., voids) between the gas manifold 140 and the liners 160, 170, 190. Having the gas manifold 140 being formed of a metallic material (e.g., stainless steel) and the liners being formed of a ceramic material (e.g., quartz) can be one factor contributing to creating voids that are large enough for gases to diffuse into during processing. The different thermal properties of these materials can also lead to creating these voids during heating and cooling of the process chamber 101 during processing.

The process chamber 101 further includes the seal 155 positioned around each connector 150 inside the gas manifold 140. The seal 155 can also help prevent any gases from reaching regions (e.g., voids) between the gas manifold 140 and the liners 160, 190. In some embodiments, the seal 155 can be an O-ring. The seal 155 can be formed of a highly compressible material that allows the seal 155 to be inserted into one of the outlet portions 142 of the gas manifold. Although the seal 155 is shown as an O-ring inserted into one of the outlet portions of the gas manifold, this is only one type of sealed connection that can be used to prevent gases from diffusing into voids between the liners and the gas manifold 140. For example, in another embodiment (not shown) the outlet portion could include a protrusion extending from the rest of the gas manifold, and the connector could instead include an internal seal (e.g., an O-ring) to receive the protrusion of the outlet portion of the gas manifold. In yet another embodiment (not shown), the connector is not a separate component and is instead an integral portion of one of the liners, such as the connector being formed as part of the lower liner or part of the upper liner. The seal 155 can be positioned around this connector that is integral with the liner.

After the gases reach the gas inlet channel 165, the gases the flow along a gas flow path P over the substrate 50 and susceptor 115 to a gas outlet channel 138, so that gases can be exhausted from the interior volume 110. The gas outlet channel 138 can be formed by surfaces of the liners 160, 170, 190. The gas outlet channel 138 is fluidly coupled with the exhaust pump 139.

The processing system 100 also includes the controller 185 for controlling processes performed by the processing system 100. The controller 185 can be any type of controller used in an industrial setting, such as a programmable logic controller (PLC). The controller 185 includes a processor 187, a memory 186, and input/output (I/O) circuits 188. The controller 185 can further include one or more of the following components (not shown), such as one or more power supplies, clocks, communication components (e.g., network interface card), and user interfaces typically found in controllers for semiconductor equipment.

The memory 186 can include non-transitory memory. The non-transitory memory can be used to store the programs and settings described below. The memory 186 can include one or more readily available types of memory, such as read only memory (ROM) (e.g., electrically erasable programmable read-only memory (EEPROM), flash memory, floppy disk, hard disk, or random access memory (RAM) (e.g., non-volatile random access memory (NVRAM).

The processor 187 is configured to execute various programs stored in the memory 186, such as epitaxial deposition processes. During execution of these programs, the controller 185 can communicate to I/O devices through the I/O circuits 188. For example, during execution of these programs and communication through the I/O circuits 188, the controller 185 can control outputs, such as the position of valves to send process gases to the interior volume 110 of the process chamber 101. The memory 186 can further include various operational settings used to control the processing system 100. For example, the settings can include durations for how long the different valves remain open or closed during different depositions.

Figure 1B:
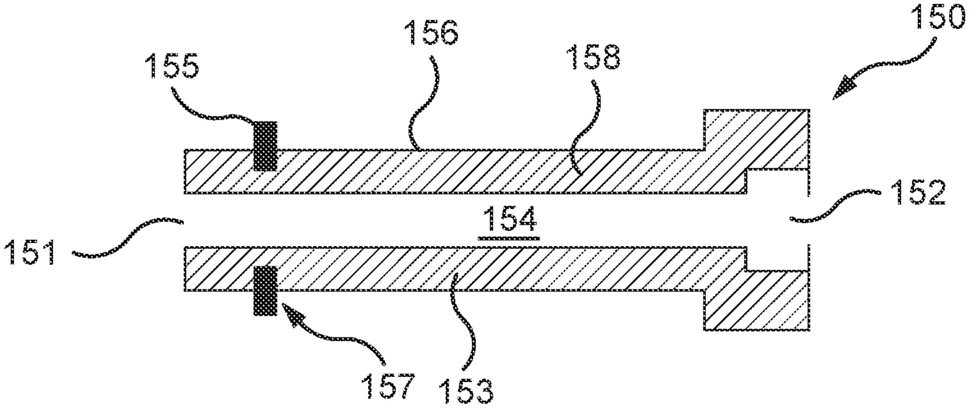
FIG. 1B is a close-up cross-sectional view of the connector and the seal shown in FIG. 1A, according to one embodiment.

FIG. 1B is a close-up cross-sectional view of the connector 150 and the seal 155 shown in FIG. 1A, according to one embodiment. The connector 150 includes a body 158 disposed around an internal channel 154. The connector 150 includes a first opening 151 at a gas inlet of the connector 150 and a second opening 152 at a gas outlet of the connector 150. The second opening 152 is connected to the first opening 151 by the internal channel 154. The body 158 of the connector 150 includes an outer surface 156. The outer surface 156 can include a recess 157 to receive the seal 155 and prevent the seal 155 from moving when the connector 150 is inserted into the outlet portion 142 of the gas manifold 140 (see FIG. 1A). The seal 155 can be compressed against surfaces of the connector 150 and the outlet portion 142 (see FIG. 1A) to assist in preventing any gas from leaking past the seal 155 and reaching the voids between the liners 160, 190 (See FIG. 1A).

Figure 1C:
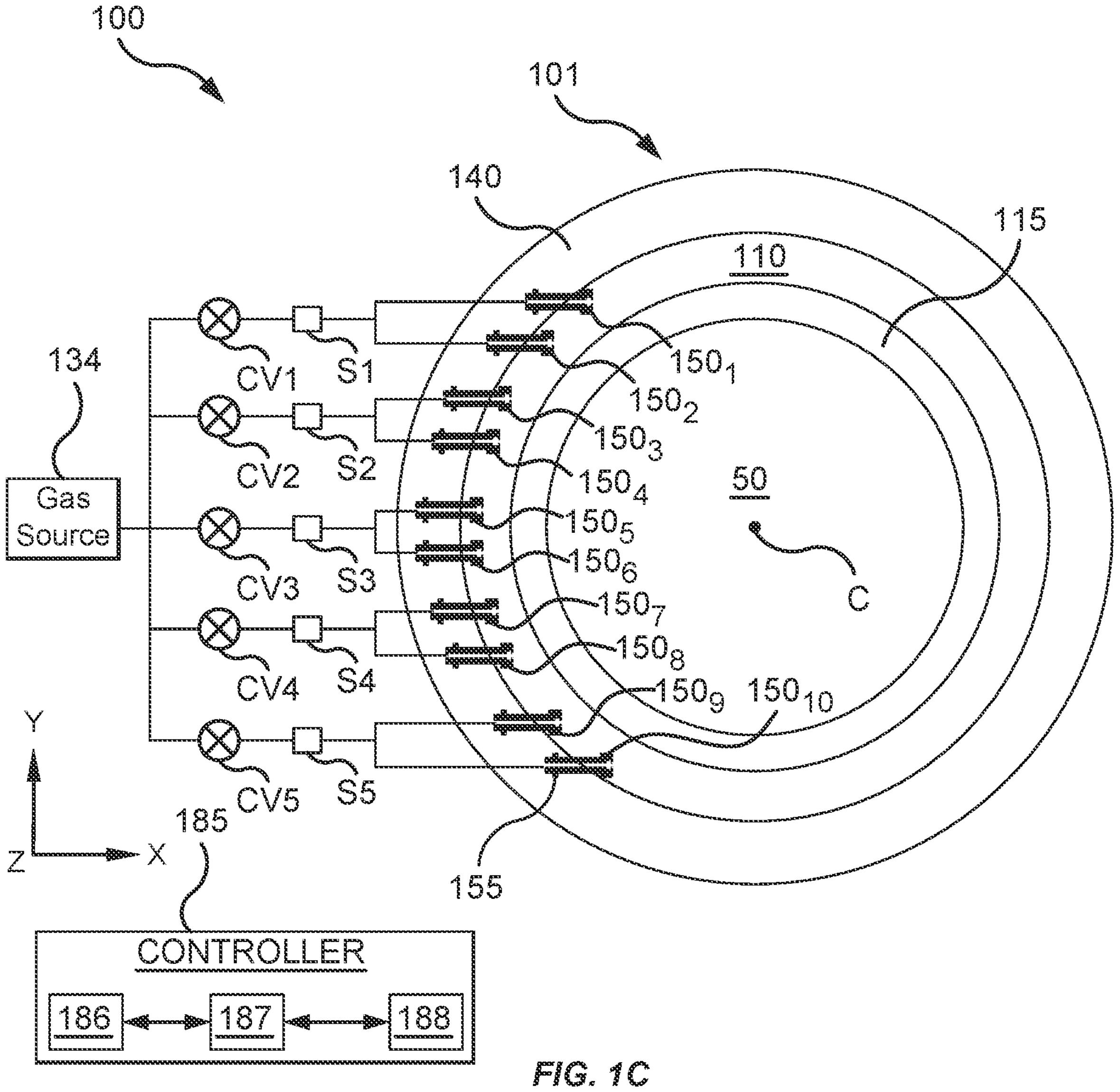
FIG. 1C is a schematic top view of the processing system, according to one embodiment.

FIG. 1C is a schematic top view of the processing system 100, according to one embodiment. The view in FIG. 1C shows a limited number of components and a simplified view of some components in order to explain the gas flow from the gas source 134 into the interior volume 110 of the process chamber 101 and over the substrate 50 positioned on the susceptor 115. For example, several components that would be visible, such as the liners and preheat ring are omitted, and others are shown as circles, such as the gas manifold 140 to simplify the illustration.

The processing system 100 can include ten connectors $\mathbf{150}_1$-$\mathbf{150}_{10}$ arranged at different angular locations relative to the center C of the susceptor 115, which also corresponds to the center of the substrate 50. Other embodiments can include more or less connectors 150. Each connector 150 can be positioned partially inside the gas manifold 140 to receive the gas supplied from the gas source 134 to the gas manifold 140. The outlet of each connector 150 can be connected to a corresponding channel 165 (not shown in FIG. 1C) that is formed by surfaces of the liners 160, 170, 190 (see e.g., FIG. 1A).

The processing system 100 can further include five control valves CV1-CV5 and five sensors S1-S5. Some embodiments can include a control valve CV and a sensor S1 for each connector 150, so that the flowrate of gas through each connector 150 can be independently controlled. For example, one embodiment can include ten connectors 150, ten control valves CV, and ten sensors S. In one embodiment, each sensor S is a flowmeter configured to provide flowrate measurements to the controller 185. The controller 185 can use the measurement from each sensor S to adjust the position of the corresponding control valve CV, so that a target flowrate of gas can be provided to each of the connectors 150. The seal 155 around each connector 150 can be used to prevent gases from diffusing into voids between the liners 160, 170, 190 and the gas manifold 140 and potentially entering the interior volume 110 at unintended locations such as through a different gas inlet channel 165. When gases enter the interior volume 110 at unintended locations, target levels of process uniformity (e.g., uniformity of thickness deposition across the substrate 50) are often not achieved.

Figure 1D:
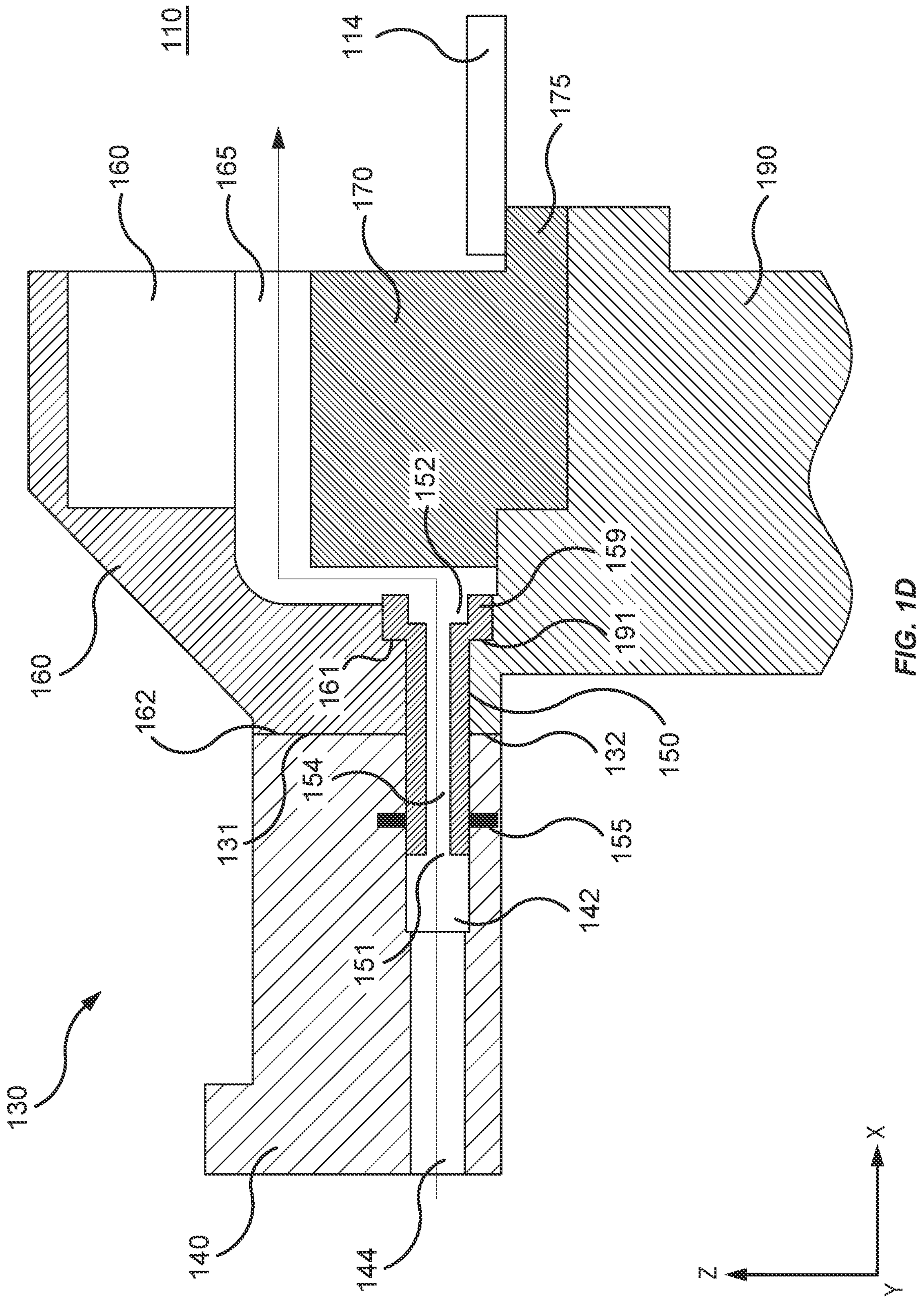
FIG. 1D is a close-up and partial view of the gas delivery assembly shown in FIG. 1A, according to one embodiment.

FIG. 1D is a close-up and partial view of the gas delivery assembly 130 shown in FIG. 1A, according to one embodiment. The close-up view in FIG. 1D allows additional features of the gas delivery assembly 130 to be shown. These additional features along with the seal 155 positioned around the connectors 150 can assist in preventing gas from reaching unintended areas of the process chamber 101. During processing, the gas from gas source 134 (see FIG. 1A) flows through the gas manifold 140, then through the connector 150, and then through the gas inlet channel 165 before reaching the interior volume 110 of the process chamber 101.

The body 153 of the connector 150 can include a rimmed portion 159 at the second opening 152 of the connector 150 at the gas outlet. The rimmed portion 159 can extend outward from the other portions of the body 153 of the connector 150. The rimmed portion 159 can extend past an inner surface 161 of the upper liner 160. The rimmed portion 159 can also extend past an inner surface 191 of the lower liner 190. Used herein, inner surfaces of the liners 160, 170, 190 refer to surfaces that are closer to the interior volume than the opposing surface of that same liner. For example, the upper liner 160 can further include an outer surface 162 that opposes the inner surface 161.

Having the rimmed portion 159 of the connector 150 extend past these inner surfaces 161, 191 creates additional barriers for the gases (e.g., gases in the in gas inlet channel 165) reaching voids between the gas manifold 140 and the liners 160, 190. Although FIG. 1D shows the gas manifold 140 contacting the upper liner 160 and the lower liner 190 with no space between these components, there is still some small voids between these components. For example, a first void 131 can be present between the gas manifold 140 and the upper liner 160. Similarly, a second void 132 can be present between the gas manifold 140 and the lower liner 190. Gas that reaches these voids 131, 132 can then move angularly around the space between the gas manifold 140 and the liners 160, 190 potentially reaching other gas inlet channels 165. This angular movement of these gases cause higher or lower flowrates than intended over portions of the substrate 50 (e.g., center versus edge of the substrate) during processing. Gases that reaches these voids 131, 132 can also cause unintended depositions or corrosion on surfaces of the liners 160, 190 and the gas manifold 140, which can affect the thermal properties of the liners and thus also the thermal uniformity of the process being performed, such as an epitaxial deposition on a substrate 50.

Figure 2A:
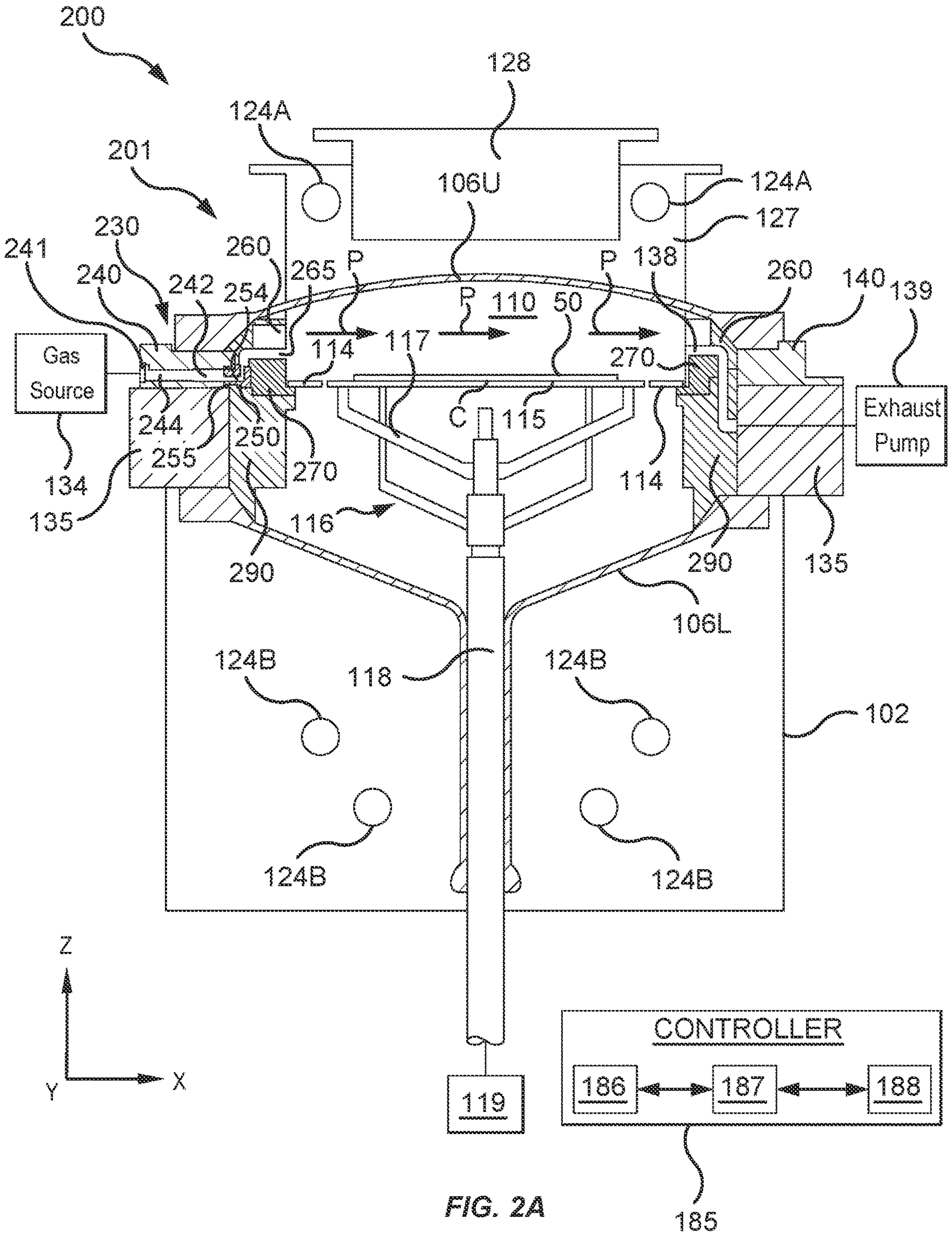
FIG. 2A is a cross-sectional view of a processing system, according to one embodiment.

FIG. 2A is a cross-sectional view of a processing system 200, according to one embodiment. The processing system 200 is the same as the processing system 100 described above (see FIG. 1A) except that the processing system 200 includes a process chamber 201 that includes a gas delivery assembly 230 that is different from the gas delivery assembly 130 of the process chamber 101 described above. The gas delivery assembly 230 is the same as the gas delivery assembly 130 except that the gas delivery assembly 230 includes a gas manifold 240, a plurality of connectors 250, and liners 260, 270, 290 instead of the gas manifold 140, the connectors 150, and the liners 160, 170, 190 described above in reference to the gas delivery assembly 130. The liners 260, 270, 290 are generally the same as the corresponding liners 160, 170, 190 described above with the exception that the liners are configured to receive the connector 250 instead of the connector 150. The liners 260, 270, 290 are positioned and sized to form a gas inlet channel 265 that is generally similar to the gas inlet channel 165 described above.

The gas manifold 240 is positioned on the base plate 135. The gas manifold 240 can include a plurality of inlet portions 241 and a plurality of outlet portions 242. Each inlet portion 241 is fluidly coupled to one of the outlet portions 242 by a corresponding internal channel 244 of the gas manifold 240. Each inlet portion 241 is connected to the gas source 134. In some embodiments, the plurality of outlet portions 242 can be positioned at a same vertical location in the Z-direction and coupled to different connectors 250 at different angular locations (see FIG. 2C) relative to a center C of the susceptor 115. In some embodiments, each outlet portion 242 is equidistant to the center C of the susceptor 115.

The gas delivery assembly 230 can further include the plurality of connectors 250. Each connector 250 is positioned partially in one of the outlet portions 242 of the gas manifold 240. Each connector 250 includes an internal channel 254 extending from a location inside one of the outlet portions 242 of the gas manifold 240 to the gas inlet channel 265. Each connector 250 extends past an inner wall of the upper liner 260 and an inner wall of the lower liner 290, which can help prevent any gases from reaching voids between the gas manifold 240 and the liners 260, 290.

The gas delivery assembly 230 further includes a seal 255 positioned around each connector 250 inside one of the outlet portions 242 of the gas manifold 240. The seal 255 can generally be similar to the seal 155 described above (e.g., formed of a same material) with the exception that the seal 255 is configured to form the sealed connection between an outlet portion 242 of the gas manifold 240 and the connector 250. The seal 255 can help prevent any gases from reaching voids between the gas manifold 240 and the liners 260, 270, 290. After the gases reach the gas inlet channel 265, the gases the flow along a gas flow path P over the substrate 50 and susceptor 115 to the gas outlet channel 138. The gas outlet channel 138 is fluidly coupled with the exhaust pump 139 to exhaust the gases from the interior volume 110.

Figure 2B:
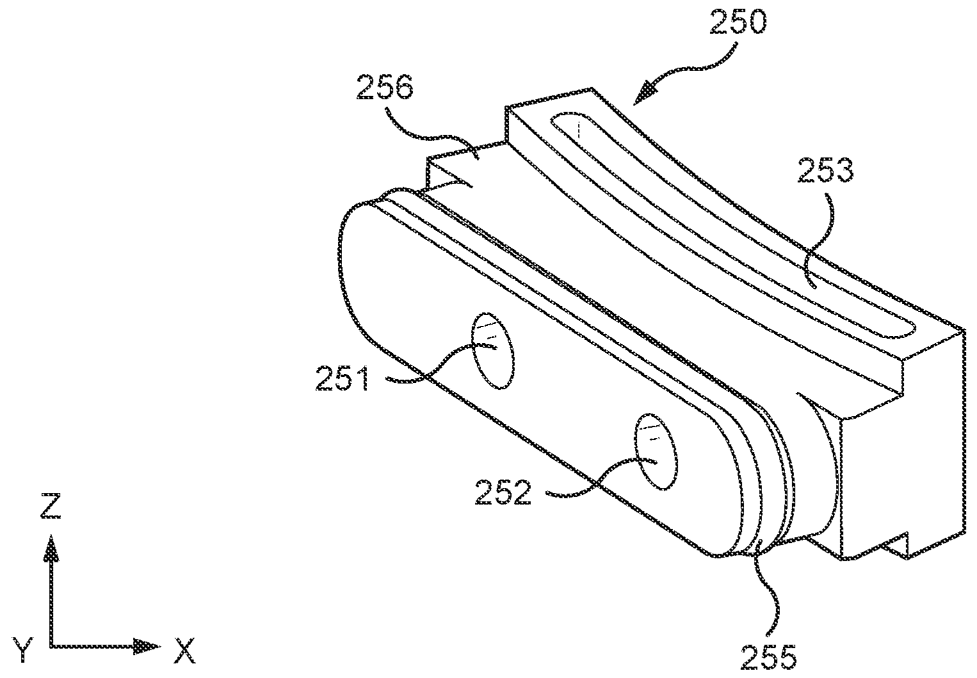
FIG. 2B is a perspective view of the connector and the seal shown in FIG. 2A, according to one embodiment.

FIG. 2B is a perspective view of the connector 250 and the seal 255 shown in FIG. 2A, according to one embodiment. The connector 250 can be formed of a ceramic material, such as quartz. The connector 250 can include a body 256 disposed around the internal channel 254 (see FIG. 2A). The connector 250 includes a first opening 251 at a first gas inlet, a second opening 252 at a second gas inlet, and a third opening 253 at a gas outlet. The internal channel 254 (see FIG. 2A) can be fluidly coupled to each of the openings 251-253, so that gas can flow from each of the openings 251, 252 at the gas inlets to the third opening 253 at the gas outlet. In some embodiments, the seal 255 is positioned in a recess formed on the outer surface of the body 256.

Figure 2C:
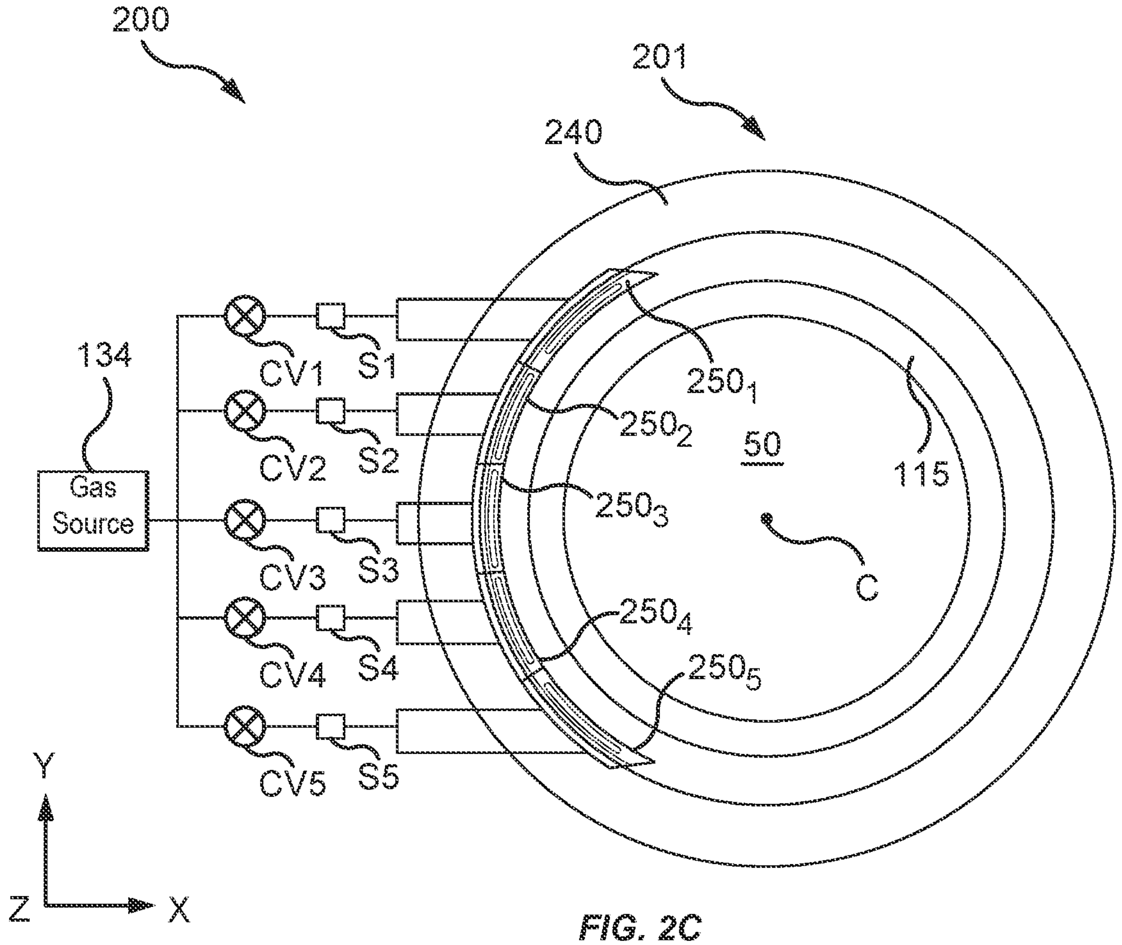
FIG. 2C is a schematic top view of the processing system of FIG. 2A, according to one embodiment.

FIG. 2C is a schematic top view of the processing system 200 of FIG. 2A, according to one embodiment. The view in FIG. 2C shows a limited number of components and a simplified view of some components in order to explain the gas flow from the gas source 134 into the interior volume 110 of the process chamber 201 and over the substrate 50 positioned on the susceptor 115. For example, several components that would be visible, such as the liners and preheat ring are omitted, and others are shown as circles, such as the gas manifold 240 to simplify the illustration.

The processing system 200 can include five connectors 2501-2505 arranged at different angular locations relative to the center C of the susceptor 115, which also corresponds to the center of the substrate 50. Other embodiments can include more or less connectors 250. Each connector 250 can be positioned partially inside the gas manifold 240 to receive the gas supplied from the gas source 134 to the gas manifold 240. The outlet of each connector 250 can be connected to a corresponding channel 265 (not shown in FIG. 2C) that is formed by surfaces of the liners 260, 270, 290 (see e.g., FIG. 2A).

The processing system 200 further include the five control valves CV1-CV5 and five sensors S1-S5 described above in reference to FIG. 1C. Thus, there is a control valve CV and a sensor S1 for each of the five connectors 250, so that the flowrate of gas through each connector 250 can be independently controlled. In one embodiment, each sensor S is a flowmeter configured to provide flowrate measurements to the controller 185. The controller 185 can use the measurement from each sensor S to adjust the position of the corresponding control valve CV, so that a target flowrate of gas can be provided to each of the connectors 250. The seal 255 around each connector 250 can be used to prevent gases from reaching voids between the liners 160, 170, 190 and the gas manifold 240 and potentially entering the interior volume 110 at unintended locations, such as through a different gas inlet channel 265. When gases enter the interior volume 110 at unintended locations, target levels of process uniformity (e.g., uniformity of thickness deposition across the substrate 50) are often not achieved.

Figure 2D:
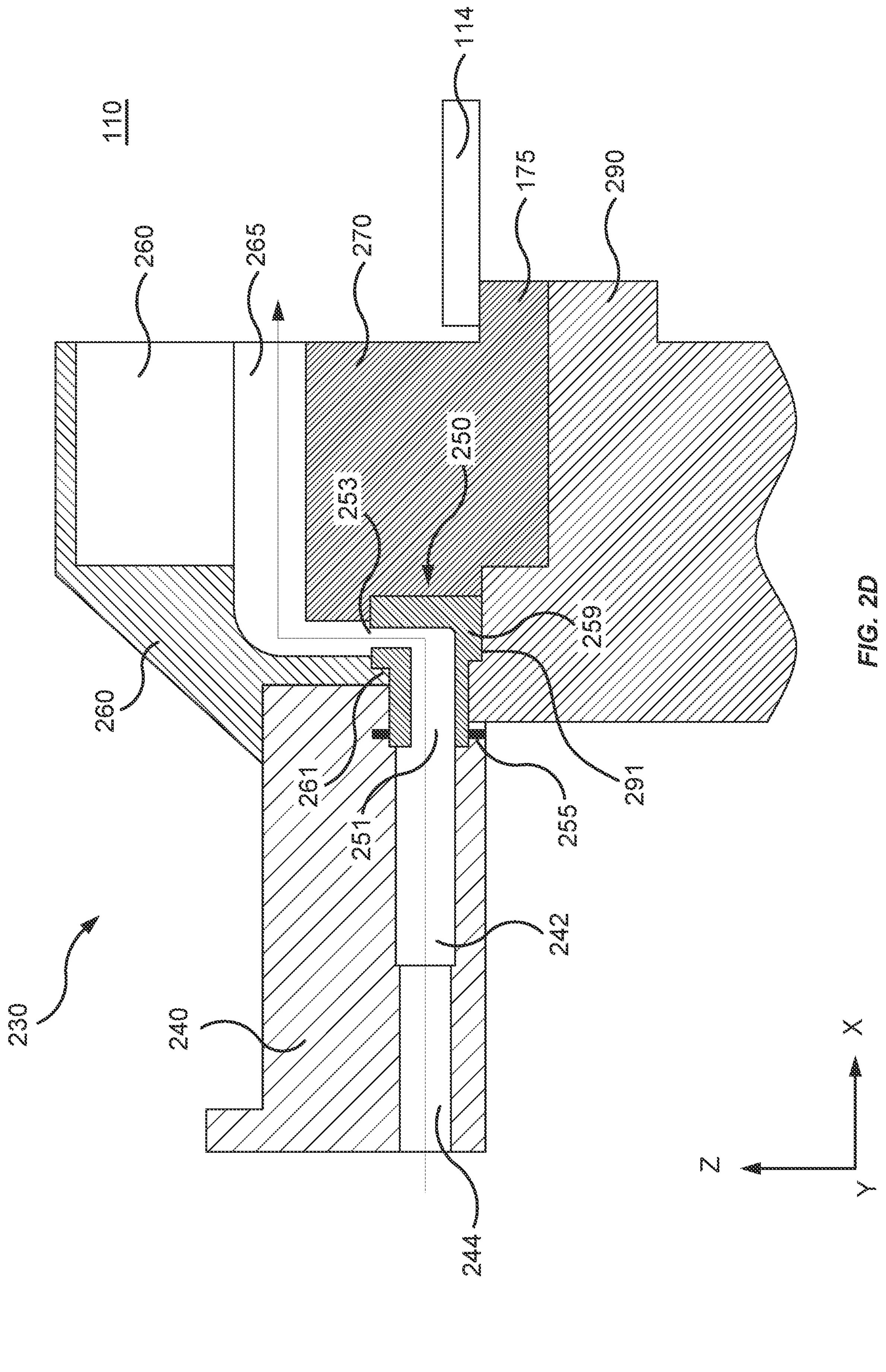
FIG. 2D is a close-up and partial view of the gas delivery assembly shown in FIG. 2A, according to one embodiment.

FIG. 2D is a close-up and partial view of the gas delivery assembly 230 shown in FIG. 2A, according to one embodiment. The close-up view in FIG. 2D allows additional features of the gas delivery assembly 230 to be shown. These additional features along with the seal 255 positioned around the connectors 250 can assist in preventing gas from reaching unintended areas of the process chamber 201. During processing, the gas from gas source 134 (see FIG. 2A) flows through the gas manifold 240, then through the connector 250, and then through the gas inlet channel 265 before reaching the interior volume 110 of the process chamber 101.

The body 256 of the connector 250 can include a protrusion 259 positioned in a recess 291 of the lower liner 290. The third opening 253 at the gas outlet of the connector 250 can extend up into the gas inlet channel 265, so that a portion of an inner surface 261 of the upper liner 260 extends below the third opening 253 between the third opening 253 and the gas manifold 240. The location of the recess 291 and the inner surface 261 create additional barriers for the gases (e.g., gases in the in gas inlet channel 265) reaching voids between the gas manifold 240 and the liners 260, 290, such as voids similar to the voids 131, 132 described above. Preventing the gases from reaching these voids leads to improved process results as the targeted concentration of gases can be supplied over different regions of the substrate 50 and there is less unintended corrosion and deposits on portions of the gas delivery assembly 230.

While the foregoing is directed to embodiments of the present disclosure, other and further embodiments of the disclosure may be devised without departing from the basic scope thereof.

What is claimed is:

1. A process chamber comprising:

a chamber body and one or more liners disposed around an interior volume;

a gas manifold including a plurality of inlet portions and a plurality of outlet portions, each inlet portion fluidly coupled to one of the outlet portions;

a plurality of gas inlet channels, each gas inlet channel formed by one or more surfaces of the one or more liners and each gas inlet channel fluidly coupled to the interior volume;

a plurality of connectors, each connector extending from one of the gas inlet channels into one of the outlet portions of the gas manifold; and a seal positioned around each connector at a location inside one of the outlet portions of the gas manifold.

2. The process chamber of claim 1, wherein the plurality of connectors includes three or more connectors, each connector positioned at a different angular location relative to a center of a substrate support positioned in the interior volume.

3. The process chamber of claim 1, wherein each connector extends past at least one inner surface of at least one of the one or more liners.

4. The process chamber of claim 1, wherein the gas manifold is formed of a metallic material.

5. The process chamber of claim 4, wherein the plurality of connectors are each formed of quartz.

6. The process chamber of claim 5, wherein each liner of the one or more liners is formed of quartz.

7. The process chamber of claim 1, wherein each seal is an O-ring positioned in a recess formed on an outer surface of one of the connectors of the plurality of connectors.

8. A process chamber comprising:

a chamber body and one or more liners disposed around an interior volume;

a substrate support disposed in the interior volume;

a gas manifold including a plurality of inlet portions and a plurality of outlet portions, each inlet portion fluidly coupled to one of the outlet portions;

a plurality of gas inlet channels, each gas inlet channel formed by one or more surfaces of the one or more liners and each gas inlet channel fluidly coupled to the interior volume; and a plurality of connectors, each connector fluidly coupling one of the outlet portions of the gas manifold to one of the gas inlet channels, wherein each connector forms a sealed connection with a corresponding outlet portion of the gas manifold.

9. The process chamber of claim 8, wherein the sealed connection for each connector is formed inside one of the outlet portions of the gas manifold.

10. The process chamber of claim 8, wherein the plurality of connectors includes three or more connectors, each connector positioned at a different angular location relative to a center of the substrate support.

11. The process chamber of claim 8, wherein each connector extends past at least one inner surface of at least one of the one or more liners.

12. The process chamber of claim 8, wherein the gas manifold is formed of a metallic material.

13. The process chamber of claim 12, wherein the plurality of connectors are each formed of quartz.

14. The process chamber of claim 13, wherein each liner of the one or more liners is formed of quartz.

15. The process chamber of claim 8, wherein each sealed connection is formed by an O-ring positioned in a recess formed on an outer surface of one of the connectors of the plurality of connectors.

16. A processing system comprising:

a process chamber comprising:

a chamber body and one or more liners disposed around an interior volume;

a substrate support disposed in the interior volume;

a gas manifold including a plurality of inlet portions and a plurality of outlet portions, each inlet portion fluidly coupled to one of the outlet portions;

a plurality of gas inlet channels, each gas inlet channel formed by one or more surfaces of the one or more liners and each gas inlet channel fluidly coupled to the interior volume;

a plurality of connectors, each connector extending from one of the gas inlet channels into one of the outlet portions of the gas manifold; and a seal positioned around each connector at a location inside one of the outlet portions of the gas manifold; and a plurality of valves, each valve fluidly coupled to a different inlet portion of the gas manifold.

17. The processing system of claim 16, further comprising a controller configured to adjust a position of each valve of the plurality of valves independently of the other valves of the plurality of valves.

18. The processing system of claim 17, wherein the plurality of connectors includes three or more connectors, each connector positioned at a different angular location relative to a center of the substrate support.

19. The processing system of claim 16, wherein each connector extends past at least one inner surface of at least one of the one or more liners.

20. The processing system of claim 16, wherein the gas manifold is formed of a metallic material, the plurality of connectors are each formed of quartz, and each liner of the one or more liners is formed of quartz.

* * * * *